United States Patent
Haralabidis et al.

(10) Patent No.: US 7,570,124 B2
(45) Date of Patent: Aug. 4, 2009

(54) LOW POWER FREQUENCY DIVISION AND LOCAL OSCILLATOR GENERATION

(75) Inventors: Nikolaos C. Haralabidis, Athens (GR); Nikolaos A. Kanakaris, Athens (GR)

(73) Assignee: Broadcom Corporation, Irvine, CA (US)

( * ) Notice: Subject to any disclaimer, the term of this patent is extended or adjusted under 35 U.S.C. 154(b) by 92 days.

(21) Appl. No.: 11/969,103

(22) Filed: Jan. 3, 2008

(65) Prior Publication Data
US 2009/0174486 A1 Jul. 9, 2009

(51) Int. Cl.
 H03B 19/00 (2006.01)
 H03L 7/00 (2006.01)
 H04B 7/00 (2006.01)

(52) U.S. Cl. .......................... 331/51; 331/25; 455/260; 455/265

(58) Field of Classification Search ................. 331/1 A, 331/8, 18, 25, 46, 51, 55, 57, 74, 172; 327/115, 327/117, 118, 156–159; 455/255, 258, 260, 455/265
See application file for complete search history.

(56) References Cited

U.S. PATENT DOCUMENTS 4,951,303 A * 8/1990 Larson ........................ 377/110
6,597,211 B2 * 7/2003 von Kaenel ................. 327/115

* cited by examiner

Primary Examiner—David Mis
(74) Attorney, Agent, or Firm—Garlick Harrison & Markison

(57) ABSTRACT

A plurality of inverters are arranged serially to form a ring oscillator and coupled to receive a reference clock signal. The reference clock signal is used to switch the inverters on and off so that not all of the inverters are on at a same time. The ring oscillator circuit is used as a divider circuit to divide the frequency of the reference clock signal to produce a local oscillator signal at a second frequency.

13 Claims, 6 Drawing Sheets

LOW POWER FREQUENCY DIVISION AND LOCAL OSCILLATOR GENERATION

BACKGROUND OF THE INVENTION

1. Technical Field of the Invention

The present invention relates generally to wireless communication systems and, more particularly, to local oscillator signal generation for wireless communication devices.

2. Description of Related Art

Mobile communication has changed the way people communicate and mobile phones have been transformed from a luxury item to an essential part of every day life. The use of mobile phones today is generally dictated by social situations, rather than being hampered by location or technology. While voice connections fulfill the basic need to communicate, and mobile voice connections continue to filter even further into the fabric of every day life, the mobile Internet and moving video, including broadcast video, are the next steps in the mobile communication revolution. The mobile Internet is poised to become a common source of everyday information, and easy, versatile mobile access to this data will be taken for granted. Similarly, video transmissions to handheld user equipment will allow movies and television programs to be viewed on the go.

Third generation (3G) cellular networks have been specifically designed to fulfill many, if not all, of these future demands. As these services grow in popularity and usage, factors such as cost efficient optimization of network capacity and quality of service (QoS) will become even more essential to cellular operators than it is today. These factors may be achieved with careful network planning and operation, improvements in transmission methods, and advances in receiver techniques. To this end, carriers want technologies that will allow them to increase downlink throughput and, in turn, offer advanced QoS capabilities and speeds that rival those delivered by cable modem and/or DSL service providers. In this regard, networks based on Code Division Multiple Access (CDMA) technology or Wideband Code Division Multiple Access (WCDMA) technology may make the delivery of data to end users a more feasible option for today's wireless carriers.

The General Packet Radio Service (GPRS) and Enhanced Data rates for GSM (EDGE) technologies may be utilized for enhancing the data throughput of present second generation (2G) systems such as GSM. The Global System for Mobile telecommunications (GSM) technology may support data rates of up to 14.4 kilobits per second (Kbps), while the GPRS technology may support data rates of up to 115 Kbps by allowing up to 8 data time slots per time division multiple access (TDMA) frame. The GSM technology, by contrast, may allow one data time slot per TDMA frame. The EDGE technology may support data rates of up to 384 Kbps. The EDGE technology may utilizes 8 phase shift keying (8-PSK) modulation for providing higher data rates than those that may be achieved by GPRS technology. The GPRS and EDGE technologies may be referred to as "2.5G" technologies.

The Universal Mobile Telecommunications System (UMTS) technology with theoretical data rates as high as 2 Mbps, is an adaptation of the WCDMA 3G system by GSM. One reason for the high data rates that may be achieved by UMTS technology stems from the 5 MHz WCDMA channel bandwidths versus the 200 KHz GSM channel bandwidths. The High Speed Downlink Packet Access (HSDPA) technology is an Internet Protocol (IP) based service, oriented for data communications, which adapts WCDMA to support data transfer rates on the order of 10 megabits per second (Mbits/s). Developed by the 3G Partnership Project (3GPP) group, the HSDPA technology achieves higher data rates through a plurality of methods.

Where HSDPA is a downlink protocol, High Speed Uplink Packet Access (HSUPA) technology addresses the uplink communication. HSUPA is also specified by the 3GPP group to provide a complement data link to HSDPA. HSUPA also offers broadband IP and is based on software. HSUPA also extends the WCDMA bit rates, but the uplink rates may be less than the downlink rates of HSDPA. Where prior protocols severely limited the uplink connections, HSUPA allows for much higher uplink rates.

Likewise, standards for Digital Terrestrial Television Broadcasting (DTTB) provide for transmission of broadcast video. Three leading DTTB systems are the Advanced Television Systems Committee (ATSC) system, the Integrated Services Digital Broadcasting-Terrestrial (ISDB-T) system, and the Digital Video Broadcasting (DVB) system, which includes terrestrial transmission under Digital Video Broadcasting-Terrestrial (DVB-T) specifications and transmissions to handheld devices under Digital Video Broadcasting-Handheld (DVB-H) specifications. DVB-H is an adaptation of DVB-T to handheld units, in which additional features are implemented to meet specific requirements of handheld units. DVB-H allows downlink channels with high data rates and may be made as enhancements to current mobile wireless networks. DVB-H may use time slicing technology to reduce power consumption of handheld devices.

In order to practice the various communication protocols, a wireless communication device is utilized. For a wireless communication device to participate in wireless communication, it typically includes a built-in radio transceiver (i.e., receiver and transmitter) or is coupled to an associated radio transceiver (e.g., a station for in-home and/or in-building wireless communication networks, RF modem, etc.). The transmitter typically includes a data modulation stage, one or more intermediate frequency (IF) stages, and a power amplifier. The data modulation stage converts raw data into baseband signals in accordance with a particular wireless communication standard. The one or more IF stages mix the baseband signals with a local oscillator signal to produce radio frequency (RF) signals. The power amplifier amplifies the RF signals prior to transmission via an antenna.

The receiver is coupled to an antenna and typically includes a low noise amplifier, one or more intermediate frequency stages, a filtering stage, and a data recovery stage. The low noise amplifier receives inbound RF signals via the antenna and amplifies them. The one or more IF stages mix the amplified RF signals with a local oscillator signal to convert the amplified RF signal into baseband signals or IF signals. The filtering stage filters the baseband signals or the IF signals to attenuate unwanted out of band signals to produce filtered signals. The data recovery stage recovers raw data from the filtered signals in accordance with the particular wireless communication standard.

One of the components in a typical RF front end is the local oscillator (LO). The LO generates a local oscillator signal that is sent to a mixer to mix the inbound RF signal for down-conversion and/or to mix the outbound signal in the transmitter for up-conversion to a RF signal for transmission. A common technique is to utilize a phase-locked loop (PLL) circuitry for generating the local oscillator signal. PLL circuits implement a closed loop phase or frequency control system that looks at the input and output of the PLL and uses a difference signal to correct for variations at the output. In this manner, a PLL may provide a stable signal at its output, which is then used to provide the LO signal.

When a wireless communication device includes both a transmitter and a receiver resident thereon, separate RF mixers are used on the receive side and the transmit side. The LO, such as the above-mentioned PLL, provides the LO signal to the mixers for up-conversion or down-conversion. With both a transmitter and a receiver, one practice is to use one PLL that generates a LO signal for the transmitter side and a second PLL that generates a LO signal for the receiver side. In some instances, the output of one or both of the PLL(s) is further frequency divided to provide the desired LO frequency for frequency conversion. For example, when a PLL output frequency is selected to be higher than the needed LO frequency, a divider is used to lower the PLL output to a lower frequency of the LO signal. As another example, when multiple LO signals are to be generated at different frequencies, a PLL output may be divided by one or more frequency dividers to produce multiple LO signals at having different LO frequencies. Thus, for these reasons, as well as other, a divider circuitry may be used to divide the PLL output to generate one or more LO signal(s).

A typical practice known in the art is to use current mode logic (CML) circuitry to generate the LO outputs. CML allows the use of differential logic to transmit signals at high speed. Thus, CML or pseudo-CML circuits are used for LO signal generation and dividers at the output of a PLL may also use such CML circuits. When CML circuits are implemented using Complementary Metal-Oxide-Semiconductor (CMOS) technology, resistive loads are typically employed with each of the P and N side of the differential circuit, as well as a common tail current source. The tail current source is typically in a common source leg (for N-type devices) of both the P and N sides. The current source has a high output channel conductance and, therefore, the current source is modulated by its Vds voltage. This may result in excessive variation of total current drain and may introduce switching noise into the power supply line. In reference to the resistive loads, the resistor values are typically small, in order to ensure a low far-spectrum phase noise. However, small resistor values may require high tail current to ensure proper voltage levels for switching.

Furthermore, CML topology is such that the circuit, including the tail current source, is turned on (active state) at all or substantially a good portion of the time. CML topology may also suffer from reduced output swing, so an appropriate converter may be required to restore rail-to-rail switching. All of these actions consume power, which is a major concern for handheld battery operated devices.

In order to circumvent some of the concerns with the use of CML or pseudo-CML circuits for LO signal generation, another technique is warranted. Therefore, a need exists for a technique to generate LO signals without the use of CML topology.

SUMMARY OF THE INVENTION

The present invention is directed to apparatus and methods of operation that are further described in the following Brief Description of the Drawings, the Detailed Description of the Embodiments of the Invention, and the Claims. Other features and advantages of the present invention will become apparent from the following detailed description of the embodiments of the invention made with reference to the accompanying drawings.

DETAILED DESCRIPTION OF THE EMBODIMENTS OF THE INVENTION

The embodiments of the present invention may be practiced in a variety of settings that utilize a wireless communication transceiver. The specific embodiments described below pertain to a LO signal generation circuit used at a RF front-end of a wireless device. However, the invention need not be limited to such applications and different embodiments of the invention may be implemented in other circuitry and used in other applications. For example, embodiments of the invention may be readily implemented in a downlink device, as well as in an uplink device.

Figure 1:
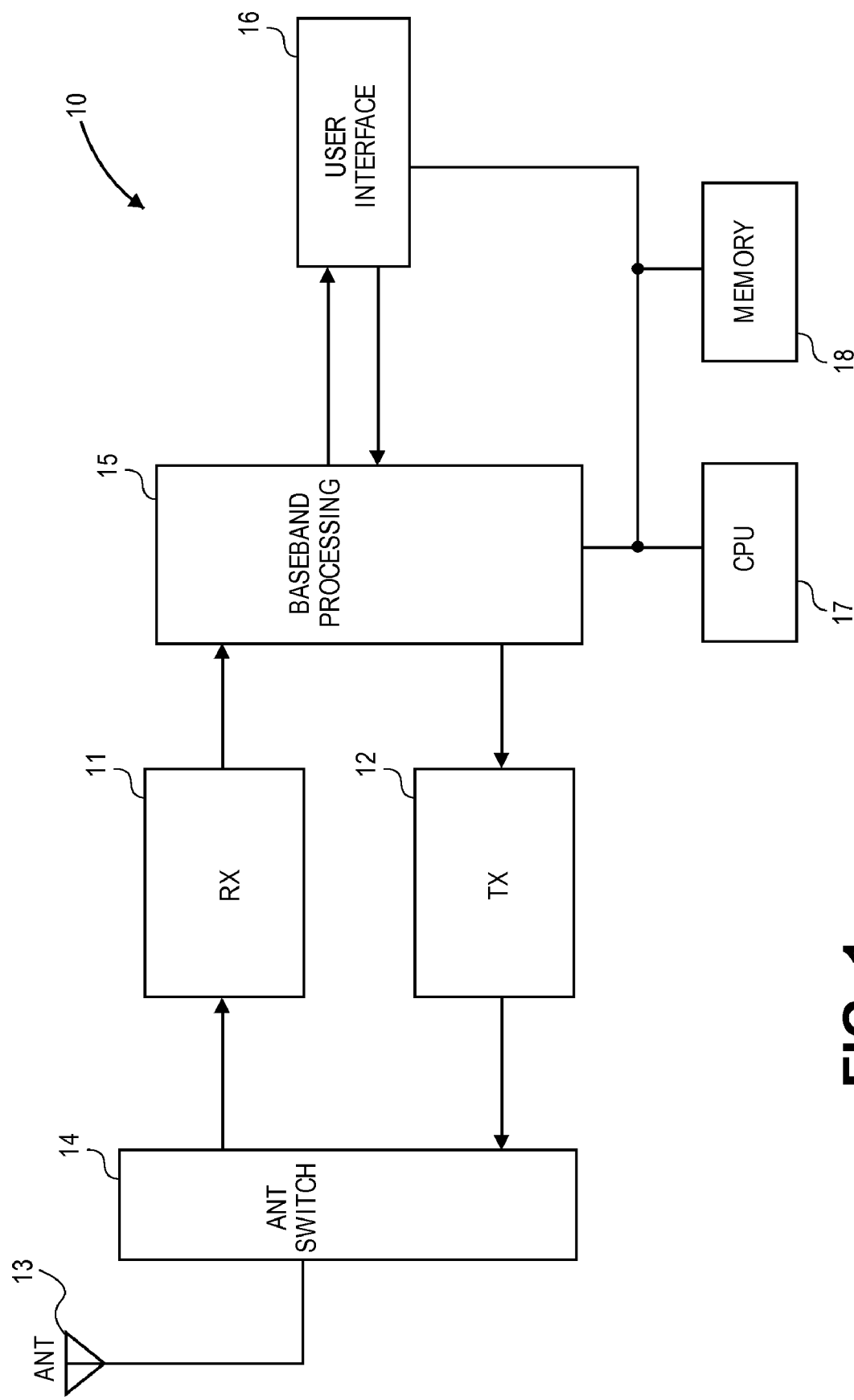
FIG. 1 is a block diagram showing an exemplary downlink device used in a wireless communication system.

FIG. 1 shows a wireless device 10 which is used in a wireless communication system. Device 10 may be of a variety of wireless devices for sending and receiving data. As such, device 10 may be a computing device, a routing device, a communication device, etc. In one instance, device 10 may be used as a user terminal or user equipment (UE) for communicating with an uplink device. Device 10 may be a cell phone for receiving and sending audio communication and/or text messaging. Device 10 may also send and receive packet traffic for communications through the Internet, or some other network. Device 10 may also send and/or receive video data. In other instances, device 10 may receive moving video and/or broadcast transmissions, such as broadcast television. Device 10 may be a computer, such as a desktop computing unit or a laptop computing unit. What is to be noted is that device 10 may operate to receive a variety of signals transmitted from another device and the received signal depends on the particular environment of the communication system that device 10 operates in. Furthermore, device 10 may transmit signals to another device. In one embodiment, device 10 may be a downlink device, such as a cell phone or some other handheld device that is operated by a user.

Device 10 includes a receiver (RX) 11 and transmitter (TX) 12 which are coupled to an antenna 13, via switch 14. Switch 14 may take many forms and may implement different radio frequency (RF) switching technology. Switch 14 may include transmit/receive (T/R) switching circuitry and/or duplexers, etc. What is to be noted is that some form of switching and/or duplexing may be implemented between antenna 13 and the RF front end of device 10. In some instances antenna 13 may comprise multiple antennas. Receiver 11 includes suitable circuitry to receive and convert inbound RF signals to inbound baseband signals. Likewise, transmitter 12 includes suitable circuitry to convert outbound baseband transmit signals to outbound RF signals for transmission from antenna 13.

Device 10 also includes a baseband processing module 15 and user interface 16. Baseband processing module 15 is coupled to receiver 11 to process the converted inbound signals from receiver 11 and to provide an output to the user of the device through interface 16. Similarly, user inputs at interface 16 are coupled to baseband processing module 15 and outbound signals for transmission are coupled to transmitter 12. User interface 16 may take various forms including, but not limited to, a video display, keyboard, microphone, headphones and/or speakers. Baseband processing module generally performs baseband operations in signal processing for received signals and likewise for signals to be transmitted.

Device 10 may also include a general (or host) processor 17 to control various processing operations of device 10, including control functions for interface 16 and baseband processing module 15. Processor 17, in some applications, is referred to as a Central Processing Unit (CPU). A memory component 18, which may be an internal memory or an add-on memory, may be included to operate with processor 17. It is to be noted that a variety of storage devices may be implemented for memory 18. Processor 17 is shown coupled to baseband processing module 15 and user interface 16, but other connections are possible to various components of device 10 in other embodiments.

As noted above, device 10 is a wireless device and in one embodiment, device 10 operates as a downlink transceiver for receiving and sending communication signals. In one embodiment, device 10 is operated as a handheld terminal in a communication link. In particular, device 10 may operate within a cellular environment. Although a variety of receivers and transmitters (transceivers) may be implemented for RX 11 and TX 12, one particular embodiment is illustrated in FIG. 2.

Figure 2:
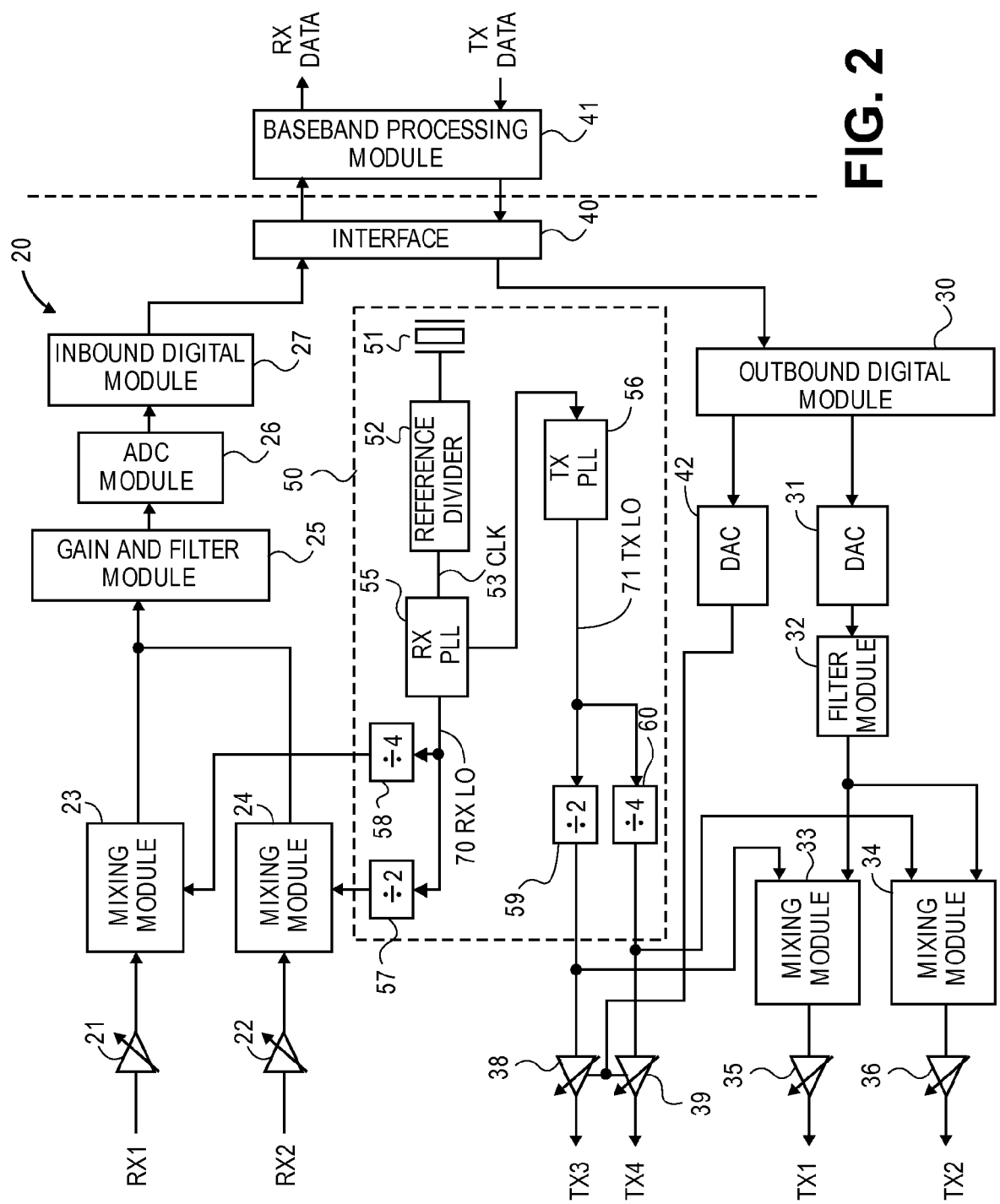
FIG. 2 is a block schematic diagram of an exemplary RF front-end of a wireless device that implements an embodiment of a LO circuit of the present invention.

FIG. 2 shows a single-chip multiple-band RF transceiver that may be implemented in a RF front-end of a variety of wireless devices, including device 10 of FIG. 1. In one embodiment, transceiver stage 20 is constructed on a single integrated circuit (IC). A baseband interface 40 couples transceiver stage 20 to a baseband processing module 41. Baseband processing module 41 may be utilized for baseband processing module 15 of FIG. 1. Furthermore, baseband processing module 41 may be constructed on the same IC as transceiver stage 20. Alternatively, baseband processing module 41 may be constructed on a separate IC.

The receiver side of transceiver stage 20 includes a first low-noise amplifier (LNA) module 21, second LNA module 22, first receiver mixing module 23, second receiver mixing module 24, gain and filter module 25, analog-to-digital converter (ADC) 26 and inbound digital module 27. The transmitter side of transceiver stage 20 includes an outbound digital module 30, first digital-to-analog converter (DAC) 31, a second DAC 42, filter module 32, first transmitter mixing module 33, second transmitter mixing module 34, first power amplifier (PA) module 35, second PA module 36, third PA module 38 and fourth PA module 39. It is to be noted that any or all of PA modules 35, 36, 38, 39 may be the power amplifier itself or a driver that drives a power amplifier that resides off-chip. Further, it is to be noted that although a specific number of LNA modules and PA modules are noted, there may be more such units in other embodiments, while in other embodiments there may only be one LNA and/or PA. Furthermore, LNA modules are hereinafter simply referred to as LNAs and PA modules are simply referred to as PAs.

In the particular embodiment of FIG. 2, multiple LNAs are used so that each LNA 21, 22 operates on a selected set or band of receiving frequencies. Similarly, multiple PAs are used so that each PA (or PA driver) operates on a selected set or band of transmitting frequencies. Thus, inbound RF input to LNA 21 is designated as RX1 and RF input to LNA 22 is designated as RX2. RX1 and/or RX2 may each be a single band or multiple band of frequencies. Outbound RF signals for transmission are noted as TX1, TX2, TX3 and TX4, which correspond to outputs from PAs 35, 36, 38, 39, respectively.

Although the range of frequencies operated on by each LNA varies from embodiment to embodiment, in one implementation, LNA 21 accepts one set of signals within a frequency band that is at approximately 800 MHz and accepts a second set of signals within a frequency band that is at approximately 900 MHz. Also with this embodiment, LNA 22 accepts signals within three separate frequency bands, where the bands are noted at approximately 1800 MHz, 1900 MHz and 2100 MHz.

It is to be noted that some frequency bands may be set standards and a given band may be identified by a single frequency designation. For example, a frequency band at 800 MHz may actually refer to frequencies in a range of 830-840 MHz. Likewise, a frequency band at 900 MHz may actually refer to frequencies in a range of 880-915 MHz or 925-960 MHz. Some of the frequency ranges may depend on whether the communication of the particular band is uplink communication or downlink communication. Typically, these frequency bands define a range of frequencies for a particular communication protocol that is being used The PAs also operate in a like manner, in which each operates to transmit signals in one or more band of frequencies. Thus, in the described example embodiment, PA 38 outputs signals within two separate frequency bands, where a first band is at approximately 1800 MHz and a second band is at approximately 1900 MHz. PA 39 is used to output signals within two separate frequency bands, where the one band is at approximately 850 MHz and the other band is at approximately 900 MHz. Likewise, PA 36 outputs signals within two frequency bands, where one band is at approximately 850 MHz and the other band is at approximately 900 MHz. PA 35 outputs signals within three frequency bands, where a first band is at approximately 1800 MHz, a second band is at approximately 1900 MHz and a third band is at approximately 2100 MHz. As noted above, these frequency bands define a range of frequencies for a particular communication protocol that is being used. Furthermore, in one embodiment, PAs 38, 39 are operable for GSM/EDGE signal transmissions, while PAs 35, 36 are operable for WCDMA transmissions. It is to be noted that other embodiments may have different frequency band schemes and those described herein are examples of particular embodiments of the invention.

Although not shown in detail, it is to be noted that the antenna circuitry, as noted by antenna 13 and antenna switch 14 in FIG. 1, may be comprised of one or more antennas, duplexers, switches, transmission lines, transformer baluns, impedance matching networks, filters (such as a Surface Acoustic Wave or SAW filter) and/or tuners to operate on and transfer the various band(s) of received signals from the antenna(s) to the appropriate LNA and transfer the various PA output signals to the antenna(s) for transmission. Furthermore, the signals may take various forms, including but not limited to GSM, EDGE, CDMA, WCDMA, GMSK (Gaussian Minimum-Shift Keying), 2-GMSK, 4-GMSK, 8-PSK (Phase-Shift Keying), MSK (Minimum-Shift Keying), FSK (Frequency-Shift Keying), ASK (Amplitude-Shift Keying), QPSK (Quadrature Phase-Shift Keying), QAM (Quadrature Amplitude-Shift Keying), BPSK (Binary Phase-Shift Keying) and 8-PSK, just to name a few.

The received signal RX1 is amplified by LNA 21 and down-converted in mixing module 23. Likewise, the received signal RX2 is amplified by LNA 22 and down-converted in mixing module 24. The outputs of the two receiver mixing modules 23, 24 are coupled to gain and filter module 25 for gain adjustment and filtering of the signal and subsequently converted to digital format in ADC module 26. It is to be noted that although one receive path is shown in FIG. 2 between the modules, in actuality separate paths exist for the in-phase (I) component and the quadrature (Q) component. The I and Q outputs from ADC module 26 are coupled to inbound digital module 27, which provides further processing prior to coupling the received signals to baseband processing module 41, via interface 40. The receive output from baseband processing module is shown as RX DATA. Additionally, it is to be noted that inputs and outputs from various components on the receive path may be single-ended or differential.

The transmitter side operates in reverse. Baseband processing module 41 receives TX DATA and provides the baseband processing. The outbound signal which is to be converted and transmitted is sent to outbound digital module 30 via interface 40. Although other embodiments may have different transmitting paths, in this particular embodiment, one set of signals are sent to PAs 38, 39 via DAC 42 to generate TX3 and/or TX4. A second set of signals are sent to PAs 35, 36 via DAC 31 to generate TX1 and/or TX2. This second path utilizes a filter module 32 to filter the analog signal out of DAC 31 and the output of filter module 32 is coupled to mixing modules 33, 34, depending on the frequency of the output. The output of mixing module 33 is coupled to PA 35 to output TX1 and output of mixing module 34 is coupled to PA 36 to output TX2. As noted above, although one line is shown in FIG. 2 between the modules in each transmitting path, in actuality separate paths exist for the I and Q components from inbound digital module 30 to PAs 35, 36. Furthermore, as noted above, the particular embodiment shown is operable to transmit TX3 and TX4 signals as GSM/EDGE signal transmissions, while TX1 and TX2 signals are WCDMA transmissions. Additionally, it is to be noted that inputs and outputs from various components on the transmit path may be single-ended or differential.

Furthermore, it is to be noted that baseband processing module 41 may perform a variety of processing at the baseband level, including but not limited to one or more of scrambling, encoding, constellation mapping, modulation, frequency spreading, frequency hopping, beamforming, space-time-block encoding, space-frequency-block encoding, and/or digital baseband to IF conversion to convert the outbound signal. Depending on the desired formatting of the outbound signal, the baseband processing module 41 may generate the outbound signal as Cartesian coordinates (e.g., having an in-phase signal component and a quadrature signal component to represent a symbol), as Polar coordinates (e.g., having a phase component and an amplitude component to represent a symbol), or as hybrid coordinates.

In addition, it is to be noted that baseband processing module 41 also converts the inbound signal by performing a variety of processing at the baseband level, including but not limited to, one or more of descrambling, decoding, constellation demapping, modulation, frequency spreading decoding, frequency hopping decoding, beamforming decoding, space-time-block decoding, space-frequency-block decoding, and/or IF to digital baseband conversion to convert the inbound signal.

In order to generate local oscillator signals for performing signal conversion, transceiver stage 20 also includes a local oscillator generator module (LO GEN) 50. LO GEN 50 includes a reference clock source, which in this example embodiment is a reference crystal 51. Crystal 51 operates as a clock reference and a particular clock frequency is selected for the reference clock for LO GEN 50. This reference clock is first coupled through a reference divider 52 and then the divided reference clock (CLK) signal 53 of lower frequency is coupled as input to a reference input of a receiver (RX) PLL 55. It is to be noted that although divider 52 is shown in FIG. 2, in other embodiments, there may not be such a divider 55, so that the reference clock frequency is coupled as input to PLL 55 without any frequency division.

Subsequently, PLL output from RX PLL 55 provides a receiver local oscillator (RX LO) signal 70 and this RX LO signal is coupled through divider 57 and then to mixing module 24 as a first divided RX LO signal. The RX LO signal is also coupled through divider 58 and then to mixing module 23 as a second divided RX LO signal. In the particular embodiment shown, divider 57 is a divide-by-two ($\div 2$) divider, while divider 58 is a divide-by-four ($\div 4$) divider. Thus, in the shown embodiment, divider 57 divides RX LO signal 70 by a factor of two for down conversion of the received signal RX2 in mixing module 24, while divider 58 divides RX LO signal 70 by a factor of four for down conversion of the received signal RX1 in mixing module 23.

An output from RX PLL 55 is also coupled to a reference input of TX PLL 56. The signal output from RX PLL 55 to TX PLL 56 may be the RX LO signal 70 or a frequency scaled signal obtained from a feedback path of RX PLL 55. TX PLL 56 generates a TX LO signal 71 at its output and this TX LO signal 71 is coupled through a divider 59 to generate a first divided TX LO signal. TX LO signal 71 is also coupled through a divider 60 to generate a second divided TX LO signal. The first divided TX LO signal is coupled to mixing module 33 and PA 38, while the second divided TX LO signal is coupled to mixing module 34 and PA 39. In the particular embodiment shown, divider 59 is a divide-by-two ($\div 2$) divider, while divider 60 is a divide-by-four ($\div 4$) divider. Thus, in the shown embodiment, divider 59 divides TX LO signal 71 by a factor of two for up conversion to generate transmit signals TX1 and TX 3, while divider 60 divides TX LO signal 71 by a factor of four for up conversion to generate transmit signal TX2 and TX4.

It is to be noted that the particular embodiment of FIG. 2 shows two pairs of PAs. PAs 38, and 39 receive one set of outbound signals after being converted to digital format by DAC 42. This is an amplitude component (AM) signal that is modulated with the divided TX LO signal in PAs 38, 39. In one embodiment, this technique is used to generate outbound RF signals for GSM/EDGE communication protocol. The divided TX LO signals are also provided to mixing modules 33, 34 for direct conversion of another set of outbound signals in which the LO signals are modulated by the outbound signal. In one embodiment, this technique is used to generate outbound RF signals for WCDMA communication protocol.

In reference to the two PLLs shown in FIG. 2, it is to be noted that a variety of PLL circuits may be used. In a typical PLL, the output of the PLL is feedback to the input and the two frequencies are compared to generate an error (correction) signal that is a measure of their phase difference. This error signal is then used to adjust the output to the correct frequency. Generally, a reference input is coupled to a phase/frequency detector (PFD)-charge pump to measure the phase difference of the two inputs and generate an error signal. A low-pass filter is used to filter the error signal, which is then coupled to a voltage controlled oscillator (VCO) to adjust the VCO output. Aside from providing an output from the PLL, the VCO output is fed back to the PFD-charge pump. In some instances, a divider (or prescaler) is placed in the feedback loop to scale the feedback frequency.

Furthermore, it is to be noted that although an output from RX PLL 55 provides the reference input to TX PLL 56, in other embodiments, the opposite may be implemented. That is, an output from TX PLL 56 may provide the reference input to RX PLL 55. Still in other embodiments, inputs to both PLLs 55, 56 may be obtained from the reference crystal 51 or some other reference clock source.

Additionally, in the particular embodiment shown, dividers 57, 58, 59, 60 are shown as fixed dividers. That is, the divisor for each divider is fixed. However, in some embodiments, one, some or all of these dividers may be programmed to adjust the divisor value(s), so that the frequency division may be adjusted and/or switched programmably.

Figure 3:
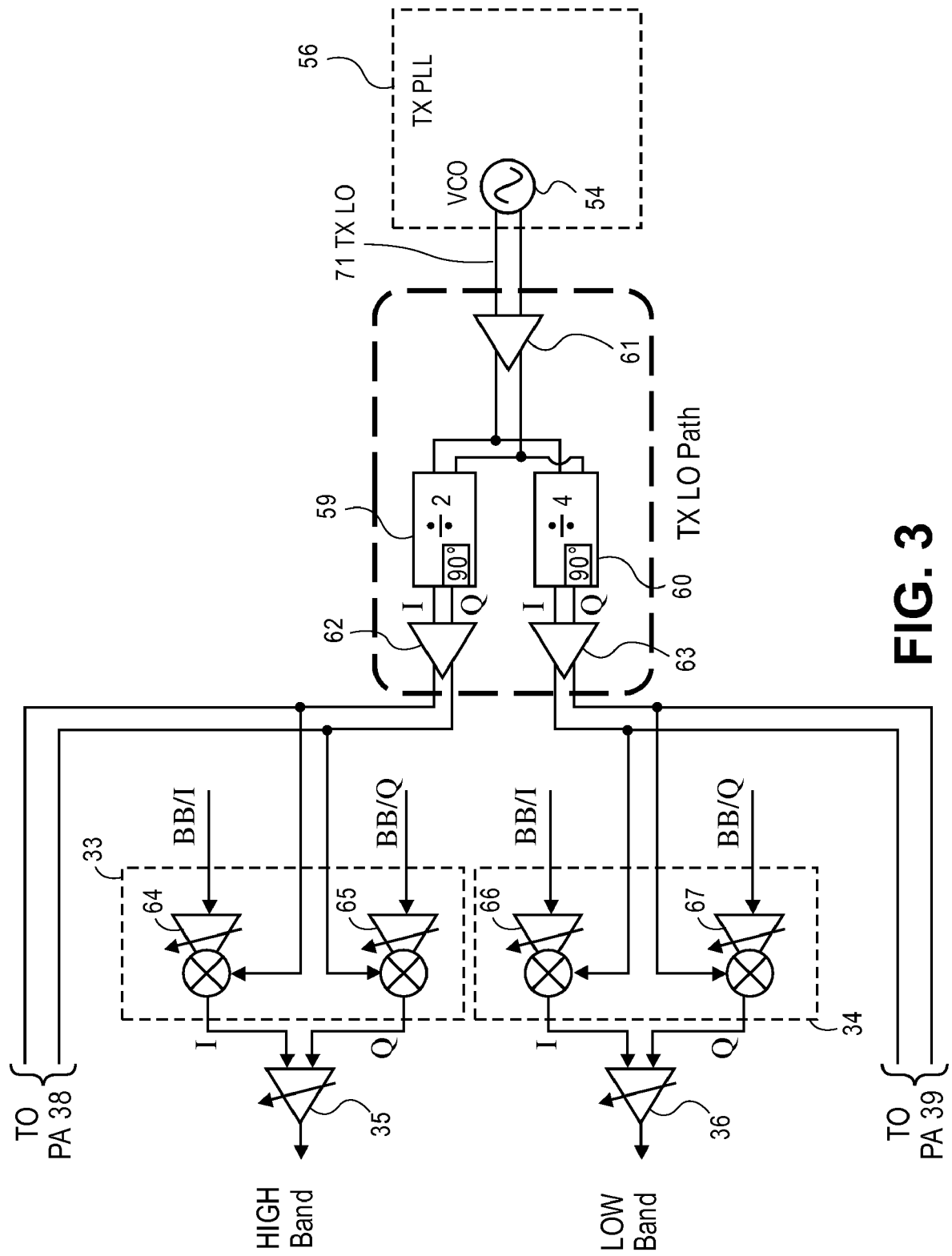
FIG. 3 is a block schematic diagram showing one embodiment of a divider circuit to generate two transmit LO signals.

FIG. 3 shows a more detailed schematic diagram for the TX LO path from TX PLL 56 to the two mixing modules 33, 34. In this embodiment, a VCO 54 of TX PLL 54 outputs TX LO signal 71. As noted, in this particular embodiment, the output from VCO 54 is a differential output. The output from VCO 54 takes a TX LO path through dividers 59, 60 and buffers 61, 62, 63, which are shown within a dash-lined enclosure in FIG. 3. The output from VCO 54 is coupled to buffer 61 and the differential output from buffer 61 is coupled as inputs to divider 59 and divider 60. Each of the dividers perform the requisite division and generates an in-phase (I) component and a quadrature (Q) component. The Q component is provided by a 90 degree shift.

Divider 59 outputs the I and Q components of the first divided TX LO signal to buffer 62, while divider 60 outputs the I and Q components of the second divided TX LO signal to buffer 63. The I component of buffer 62 output is coupled to I-mixer 64 of mixing module 33 as the LO signal which is to be modulated by an I component of a baseband signal (BB/I). Likewise, the Q component of buffer 62 output is coupled to Q-mixer 65 of mixing module 33 as the LO signal which is to be modulated by an Q component of a baseband signal (BB/Q). The I and Q mixer outputs are coupled to PA 35 when the baseband signal is to be transmitted as transmit signal TX1, which in this example is the HIGH band.

Similarly, the I component of buffer 63 output is coupled to I-mixer 66 of mixing module 34 as the LO signal which is to be modulated by an I component of a second baseband signal (BB/I). Likewise, the Q component of buffer 62 output is coupled to Q-mixer 67 of mixing module 34 as the LO signal which is to be modulated by an Q component of the second baseband signal (BB/Q). The I and Q mixer outputs are coupled to PA 36 when the baseband signal is to be transmitted as transmit signal TX2, which in this example is the LOW band. It is to be noted that outputs of buffers 62, 63 are also respectively coupled to PAs 38, 39. In other embodiments separate buffers may be used to buffer signals to PAs 38, 39.

Figure 4:
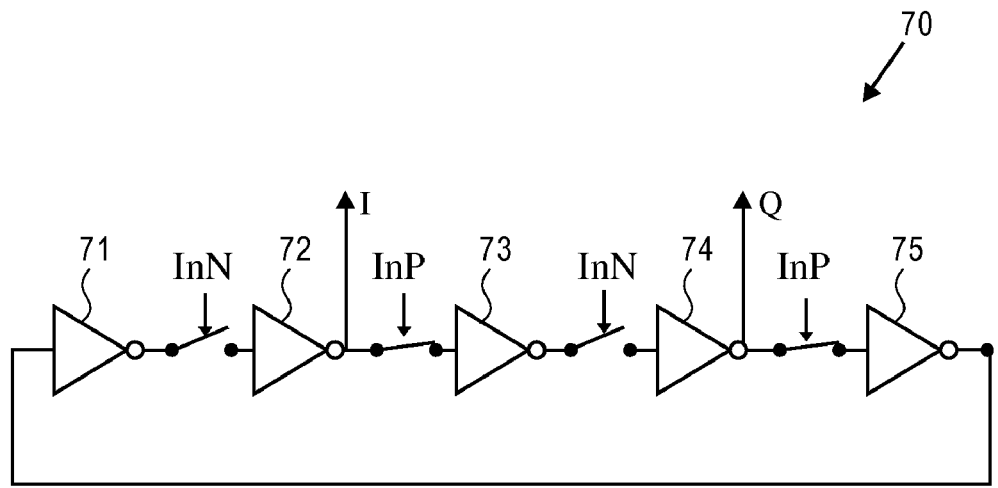
FIG. 4 is a circuit schematic diagram showing one embodiment of a divide-by-4 divider implemented in the divider circuit of FIG. 3.
Figure 5:
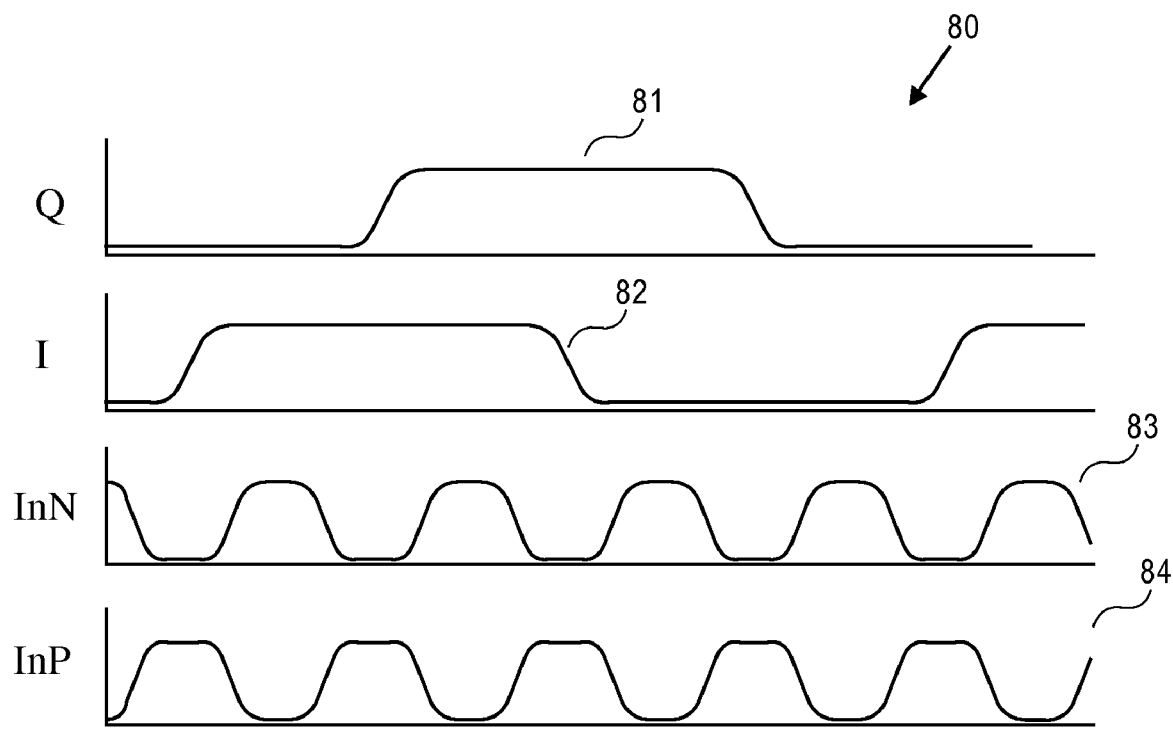
FIG. 5 is a timing diagram for the circuit of FIG. 4.
Figure 6:
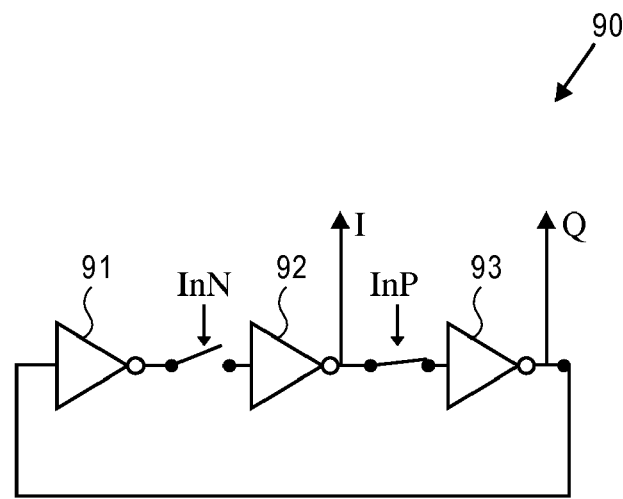
FIG. 6 is a circuit schematic diagram showing one embodiment of a divide-by-2 divider implemented in the divider circuit of FIG. 3.

Although a variety of circuits may be implemented to provide the dividing operation of dividers 59, 60, one set of examples are noted in FIGS. 4 and 6. FIG. 4 shows a divide-by-four circuit 70, which may be included within divider 60. Signal timing for circuit 70 is illustrated by diagram 80 in FIG. 5. Circuit 70 is comprised of five inverters 71, 72, 73, 74, 75 that are arranged serially to operate as a ring oscillator, with the output of the last inverter 75 coupled back to the input of the first inverter 71. The I output is obtained at the output of the second inverter 72 and the Q output is obtained at the output of the fourth inverter 74. The differential input signals to circuit 70 are noted as InN and InP. The InN and InP inputs correspond to differential outputs from buffer 61. Note that InN and InP are the buffered signals from VCO 54.

The InN and InP signals are used to switch open and close the connections between the inverters as shown in FIG. 4. Since there are five inverters in the loop, the ring oscillator is operable to divide the InN and InP timing by a factor of four. The Q, I, InN and InP signal timing is illustrated in respective waveforms 81, 82, 83, 84 of diagram 80 in FIG. 5. The InN and InP inputs have a phase timing of approximately 180 degrees apart, while the outputs I and Q have a phase difference of approximately 90 degrees.

While circuit 70 provides a divide-by-four frequency divider, circuit 90 of FIG. 6 provides a divide-by-two frequency divider. Circuit 90 may be included within divider 59. Circuit 90 is equivalent to circuit 70 of FIG. 4, but circuit 90 is a ring oscillator that is comprised of only three inverters 91, 92, 93. Three inverters are used since only a divide-by-two frequency division is obtained from divider 59.

In operation, signals InN and InP are used to switch open and close the connections between the inverters, typically by controlling a pass gate. The schematics of FIGS. 4 and 6 show the on/off actions as open/close actions of a switch for circuits 70, 90. When InN connection(s) is/are open, the InP connection(s) is/are closed, and vice versa. At any given time, only some of the connections are turned on while other connections are turned off.

Dividers 70 and 90 and constituent inverters 71, 72, 73, 74, 75 and 91, 92, 93 are shown as single ended circuits for simplicity reasons, whereas in reality the components may be differential for better signal integrity and noise immunity. In one embodiment, this is accomplished by using a differential latched inverter circuit, such as the circuit shown in FIG. 7. In this case, double (parallel) switches may be used to open/close the connections between the inverters. These double (parallel) switched are controlled by the InP and InN signals accordingly.

Figure 7:
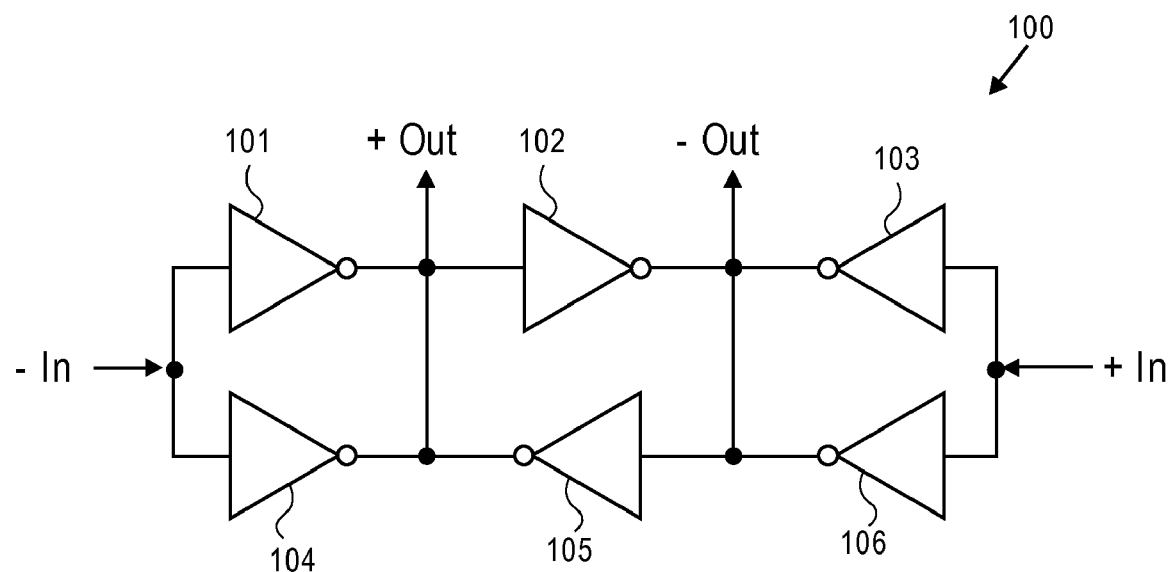
FIG. 7 is a circuit schematic diagram showing one embodiment of a latched inverter that is implemented in the divider circuit of FIG. 3.

FIG. 7 shows a differential latched inverter circuit 100 that may be implemented for one or more of the inverters shown in dividers 59, 60 and/or buffers 61, 62, 63 of FIG. 3. Circuit 100 has six inverters 101, 102, 103, 104, 105, 106, arranged in two branches, as shown in FIG. 7. A pair of differential inputs −In and +In are input at the two ends, while outputs −Out and +Out are obtained from the interior nodes of the inverter connections, so that circuit 100 operates as a fully differential latched inverter with symmetric loading. For example, when circuit 100 is used for buffer 61, the −In and +In inputs correspond to the signal inputs from VCO 54 and outputs −Out and +Out correspond to the inputs to the dividers 59, 60. Furthermore, circuit 100 may also be used for buffers 62, 63 as well. Likewise, circuit 100 may be employed within one or both of the divider circuits 70, 90.

Figure 8:
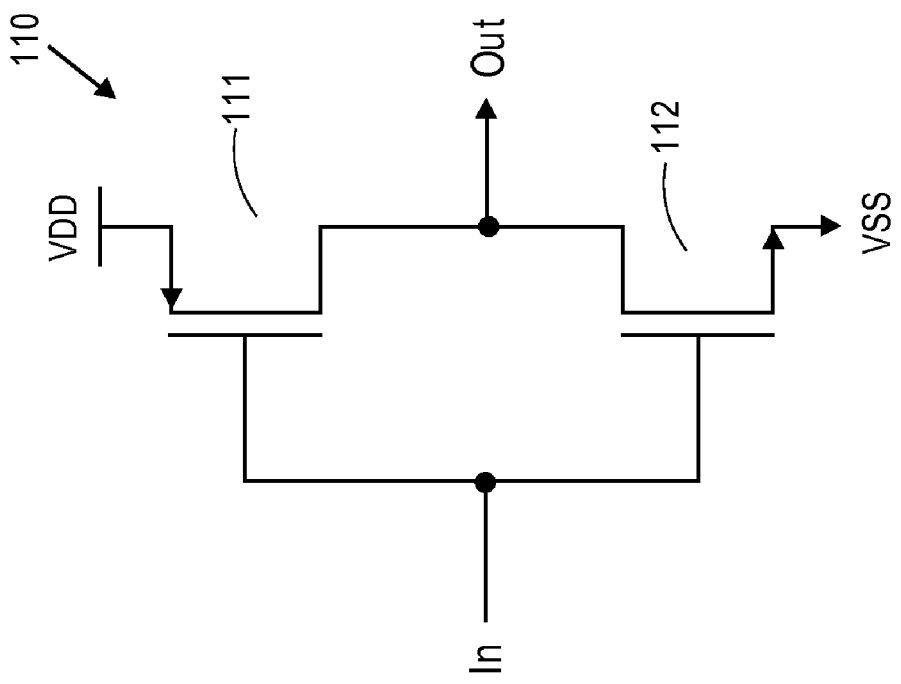
FIG. 8 is a circuit schematic diagram showing one embodiment of a CMOS inverter that may be implemented in the divider circuit of FIG. 3.

The inverters used in the dividers and/or the buffers described above may be constructed in a variety ways. When constructed using CMOS technology, FIG. 8 illustrates a standard two-transistor inverter circuit 110 that may be used for the inverter circuit. A p-type transistor device 111 and n-type transistor device 112 may be coupled between VDD and VSS, in which the input is used coupled to the gates of the transistors 111, 112. The output is obtained from the junction of the two drains.

Figure 9:
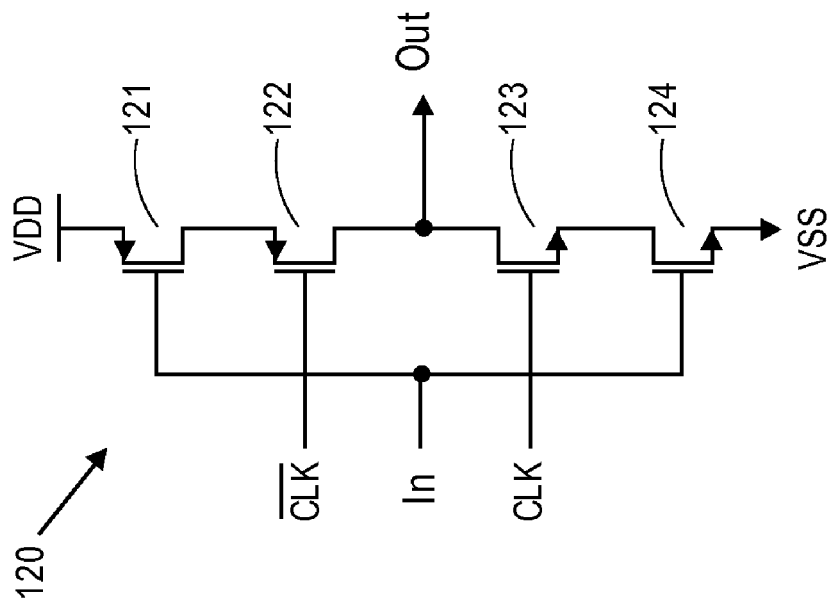
FIG. 9 is a circuit schematic diagram showing one embodiment of a CMOS gated tri-state inverter that may be implemented in the divider circuit of FIG. 3.

Alternatively, gated tri-state inverter circuit 120 of FIG. 9 may be used. Two P-type transistor devices 121, 122 and two n-type transistor devices 123, 124 may be used in which the input is coupled to the gates of transistors 121, 124. A clock signal and its complement are coupled to the gates of the other two transistors 123, 122, respectively. The clock signals are used to gate the tri-state condition for inverter 120. It is to be noted that other inverter circuits may be used in other embodiments and the inverters are not limited to circuits 110 and 120.

The ring oscillator loop design of circuit 70 and 90 implements switched connections between the inverters. This has the advantage of breaking the ring-oscillator loop to prevent oscillations within the circuit. By use of N+1 inverter stages, the signal requires N input clock cycles to propagate to the output, which results in a division of the input clock signal by a factor of N. The input clock may be either analog or digital. The ring oscillator design above is fully differential and may be used as a simple divider, or as a divider for I and Q signals with phase shift. Furthermore, current drain is reduced from prior art CML design, since the inverters are switched on/off (time-switching). Not only is overall power consumption reduced, but due to smaller absolute current, coupling of switching noise to power supply lines is minimal. Typically, the switched inverter design may be implemented in much smaller silicon area versus CML circuits. The described technique substantially reduces the produced switch noise that may be introduced on the power supply lines and improves RF performance of a transceiver, especially those RF transceivers that are constructed on a single integrated circuit as a system-on-chip (SoC). Additionally, inherent phase error is negligible due to hard switching action and minimal buffering is required in the LO path due to small capacitive loading.

Accordingly, a low power frequency division and local oscillator generation is described. The particular described implementation pertained to LO generation in the TX path (e.g. FIG. 3). However, the LO generation in the RX path may also readily implement the above-described technique as well. Various embodiments of the invention may be implemented in 3G and/or 4G cellular network devices, as well as in devices that use other standards, such as Long Term Evolution (LTE) standard.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items.

Furthermore, the term "module" is used herein to describe a functional block and may represent hardware, software, firmware, etc., without limitation to its structure. A "module" may be a circuit, integrated circuit chip or chips, assembly or other component configurations. Accordingly, a "processing module" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions and such processing device may have accompanying memory. A "module" may also be software or software operating in conjunction with hardware.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:
1. An apparatus comprising:
    a phase-locked loop (PLL) coupled to receive a reference input and to generate a reference PLL signal at its output at a first frequency; and
    a frequency divider circuit coupled to receive the reference PLL signal and to divide the first frequency to generate a local oscillator signal at a second frequency, the frequency divider circuit including a series of inverters that are switched on and off by the reference PLL signal.
2. The apparatus of claim 1, wherein the series of inverters are differential latched inverters.
3. The apparatus of claim 1, further including a buffer coupled between the PLL and the frequency divider circuit to buffer the reference PLL signal.
4. The apparatus of claim 1, wherein the inverters are gated tri-state inverters.
5. The apparatus of claim 2, wherein the frequency divider circuit generates both an in-phase local oscillator signal and a quadrature local oscillator signal.
6. An apparatus comprising:
    a buffer to receive a phase-locked loop (PLL) signal from a PLL at a first frequency and to output a differential buffered PLL signal; and
    a frequency divider circuit coupled to receive the differential buffered PLL signal and to divide the first frequency to generate a local oscillator signal at a second frequency, the frequency divider circuit including a plurality of inverters that are arranged serially to form a ring oscillator, in which the differential buffered PLL signal is used to switch the inverters on and off so that not all of the inverters are on at a same time to reduce power consumption.
7. The apparatus of claim 6, wherein the inverters are differential latched inverters.
8. The apparatus of claim 6, wherein the inverters are gated tri-state inverters.
9. The apparatus of claim 6, wherein the ring oscillator generates both an in-phase local oscillator signal and a quadrature local oscillator signal.
10. The apparatus of claim 6 further comprising a mixing module coupled to receive the local oscillator signal for radio frequency (RF) signal conversion, in which the buffer, frequency divider, mixer and a PLL are part of a RF front end and constructed on a same integrated circuit.

11. A method comprising:

generating a reference clock signal at an output of a phase-locked loop (PLL) at a first clock frequency;

using the reference clock signal to switch on and off a plurality of inverters that are arranged serially to form a ring oscillator, in which time-switching of the inverters causes not all of the inverters to be turned on at a same time to substantially reduce power consumption; and generating a local oscillator signal as an output from the ring oscillator in which the output from the ring oscillator is at a second frequency that is approximately the first frequency divided by a factor of N.

12. The method of claim 11, further including buffering the reference clock signal to generate a differential buffered clock signal that is coupled to the inverters.

13. The method claim 12, wherein generating the local oscillator signal includes generating both an in-phase local oscillator signal and a quadrature local oscillator signal.

\* \* \* \* \*